(12) United States Patent
Anderson et al.

(10) Patent No.: US 8,373,951 B2
(45) Date of Patent: Feb. 12, 2013

(54) UNIVERSAL SERIAL BUS PROTECTION CIRCUIT

(75) Inventors: Frank Anderson, Santa Barbara, CA (US); David John Vetter, Goleta, CA (US)

(73) Assignee: Robert Bosch GmbH, Stuttgart (DE)

( * ) Notice: Subject to any disclaimer, the term of this patent is extended or adjusted under 35 U.S.C. 154(b) by 232 days.

(21) Appl. No.: 12/976,275

(22) Filed: Dec. 22, 2010

(65) Prior Publication Data

US 2012/0162830 A1    Jun. 28, 2012

(51) Int. Cl.
*H02H 9/04*    (2006.01)
(52) U.S. Cl. .......................................... 361/42; 361/91.1
(58) Field of Classification Search .................. 361/91.1, 361/42–50
See application file for complete search history.

(56) References Cited

U.S. PATENT DOCUMENTS

| | | | |
|---|---|---|---|
| 6,946,904 B1 * | 9/2005 | Varma et al. .................. | 327/595 |
| 7,079,366 B1 * | 7/2006 | Teener et al. .................... | 361/56 |
| 7,497,737 B2 * | 3/2009 | Mikolajczak et al. ... | 439/620.29 |
| 8,009,400 B2 * | 8/2011 | Chao ............................. | 361/91.1 |

* cited by examiner

*Primary Examiner* — Danny Nguyen
(74) *Attorney, Agent, or Firm* — Michael Best & Friedrich LLP

(57) ABSTRACT

A universal serial bus (USB) protection circuit. The circuit includes a V+ line, a ground line, a D+ line, a D– line, a first resettable device, a second resettable device, a windowing comparator, a first switch, and a second switch. The V+ line is configured to be connected to a V+ connection of a USB cable. The ground line is configured to be connected to a ground connection of the USB cable. The D+ line is configured to be connected to a D+ connection of the USB cable. The D– line is configured to be connected to a D– connection of the USB cable. The first resettable device is coupled to the V+ line and links the V+ line to a V+ of a local device. The second resettable device is coupled to the ground line and links the ground line to a common node of the local device. The windowing comparator has a negative input coupled to the common node and a positive input coupled to the ground line. The first switch is coupled between the D+ line and a D+ of the local device, and is driven by an output of the comparator. The second switch is coupled between the D– line and a D– of the local device, and is driven by the output of the comparator.

17 Claims, 3 Drawing Sheets

UNIVERSAL SERIAL BUS PROTECTION CIRCUIT

BACKGROUND

The invention relates to a circuit for prevent damage to circuits connected to a universal serial bus (USB) cable. Specifically, the circuit prevents damage due to ground faults.

USB is used to connect electronic devices together, allowing the devices to share data. The electronic devices can be damaged by transients or ground faults that may occur while the devices are connected.

SUMMARY

In one embodiment, the invention provides a universal serial bus (USB) protection circuit. The circuit includes a V+ line, a ground line, a D+ line, a D− line, a first resettable device, a second resettable device, a windowing comparator, a first switch, and a second switch. The V+ line is configured to be connected to a V+ connection of a USB cable. The ground line is configured to be connected to a ground connection of the USB cable. The D+ line is configured to be connected to a D+ connection of the USB cable. The D− line is configured to be connected to a D− connection of the USB cable. The first resettable device is coupled to the V+ line and links the V+ line to a V+ of a local device. The second resettable device is coupled to the ground line and links the ground line to a common node of the local device. The comparator has a negative input coupled to the common node and a positive input coupled to the ground line. The first switch is coupled between the D+ line and a D+ of the local device, and is driven by an output of the comparator. The second switch is coupled between the D− line and a D− of the local device, and is driven by the output of the comparator.

In another embodiment, the invention provides a method of protecting a local device coupled to a universal serial bus cable. The method includes increasing a resistance of a resettable device when a ground fault occurs to uncouple a common node of the local device from a ground line, detecting a voltage differential between the common node and the ground line, opening a first switch to uncouple a first data line with the local device, and opening a second switch to uncouple a second data line with the local device.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Various components are described below as having nodes. This is done to make the description more clear and is not intended to be limiting. Other component structures are contemplated, including components with leads, surface mount components, application specific integrated circuits, etc.

Figure 1:
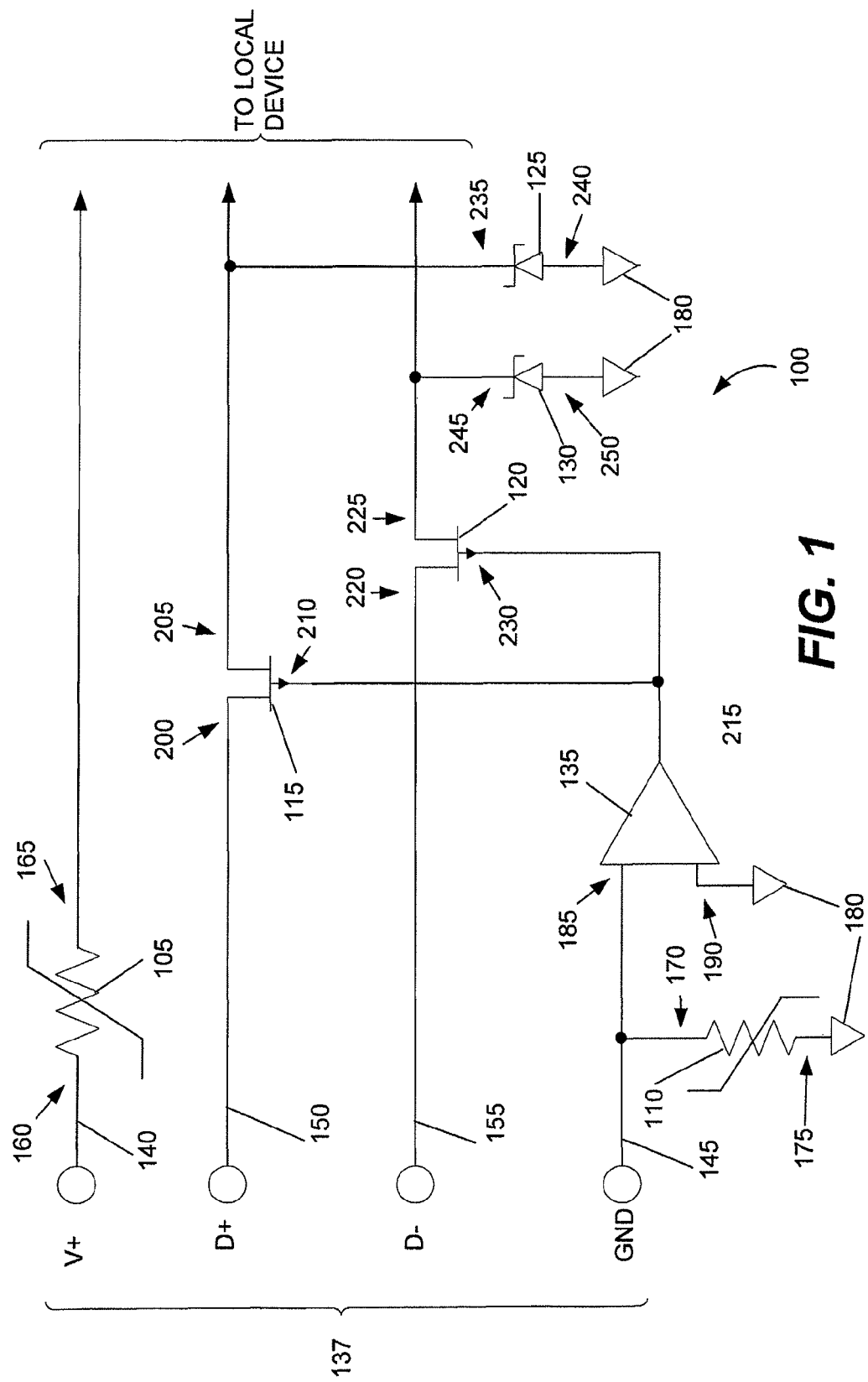
FIG. 1 is a schematic diagram of a circuit for protecting a device connected to a universal serial bus.

FIG. 1 is a schematic diagram of a circuit 100 for protecting a device or circuit from transients and ground faults present at a USB interface. The following examples describe a USB 2.0 interface; however, other USB implementations are contemplated.

The circuit 100 includes a first resettable device 105 (e.g., a polyswitch model #ASMD050E-2 manufactured by Tyco, Inc.), a second resettable device 110, a first switch 115 (e.g., an opto coupled field effect transistor), a second switch 120, a first electrostatic discharge (ESD) protection diode 125 (e.g., a zener diode), a second ESD diode 130, and a comparator 135.

The circuit 100 is connected to a standard USB cable 137. The USB cable 137 includes a V+ line 140, a USB GND line 145, a D+ line 150 (a first data connection), and a D− line 155 (a second data connection) as is known in the industry. The lines are intended to couple a local device to a USB cable via a USB connector and ultimately to a remote device. The circuit 100 can be incorporated into a USB connector or can be part of the local device.

The first resettable device 105 has a first node 160 and a second node 165. The first node 160 is coupled to the V+ line 140. The second node 165 acts as a 5 volt power source for the circuit that is interfacing with the USB.

The second resettable device 110 has a first node 170 and a second node 175. The first node 170 is coupled to the USB GND line 145. The second node 175 is coupled to a common node 180 for the circuit that is interfacing with the USB. A positive input 185 of the windowing comparator 135 is coupled to the USB GND line 145. A negative input 190 of the windowing comparator 135 is coupled to common node 180.

The first switch 115 has a first node 200 coupled to the D+ line 150, a second node 205 coupled to a D+ line of the circuit that is interfacing with the USB, and an input 210 coupled to an output 215 of the comparator. The second switch 120 has a first node 220 coupled to the D− line 155, a second node 225 coupled to a D− line of the circuit that is interfacing with the USB, and an input 230 coupled to the output 215 of the comparator 135.

The first ESD diode 125 has a first node 235 coupled to the D+ line of the circuit that is interfacing with the USB and a second node 240 coupled to common node 180. The second ESD diode 130 has a first node 245 coupled to the D− line of a local device and a second node 250 coupled to common node 180.

During normal operation, there is little or no difference in voltage levels between the first and second nodes 160 and 165 of the first resettable device 105 and between the first and second nodes 170 and 175 of the second resettable device 110. When there is little or no voltage differential, the resistance of the resettable devices 105 and 110 is near zero ohms. The inputs 185 and 190 of the windowing comparator 135 are therefore approximately equal and the output 215 of the comparator 135 is low. The low output causes the switches 115 and 120 to close, propagating the signals at the D+ and D− lines 150 and 155 to the local device.

If a ground fault occurs, a voltage differential exists between the first node 170 and the second node 175 of the first resettable device 110. The differential causes the resistance of the first resettable device 110 to increase substantially (e.g., to several megohms), effectively creating an open circuit between the USB GND line 145 and the common node 180.

The windowing comparator 135 detects the voltage differential at the inputs 185 and 190, resulting in the output 215 going high. The high output opens the switches 115 and 120. As a result, the local device is protected from the ground fault by being isolated from the USB GND, D+, and D− lines 145, 150, and 155. Once the ground fault is corrected, the resistance of the first resettable device 110 returns to near zero ohms, removing the voltage differential at the inputs 185 and 190 of the comparator 135. The output 215 returns to low, closing the switches 115 and 120, and operation of the system returns to normal.

Should a fault occur on the V+ line 140, a voltage differential will occur between the first and second nodes 160 and 165 of the first resettable device 105. The differential causes the resistance of the first resettable device 105 to increase substantially (e.g., to several megohms), isolating/protecting the local device from the V+ line 140. Once the fault is corrected, the resistance of first resettable device 105 returns to near zero, and operation of the system returns to normal.

Should a large transient voltage appear at the D+ and/or D− lines 150 and 155, first ESD diode 125 (for the D+ line 150) and/or the second ESD diode 130 (for the D− line 155) break down, shorting the line(s) 150 and/or 155 to common. Thus, the local device is protected from transient voltages on the D+ and D− connectors 150 and 155. The ESD diodes also serve to absorb voltage surges until the switching circuits activate.

The circuit 100 can be designed to protect a device at greater than twice the expected voltage. For example, in an automobile, the expected voltage can be 27 volts and the circuit 100 can be designed to protect up to 54 volts. The circuit 100 protects against both positive and negative voltage offsets. The circuit 100 requires no intervention by a user (e.g., to replace a fuse), as the resettable devices automatically reset when the error condition goes away. Under normal conditions (i.e., no fault exists) the circuit 100 has no impact on the operation of the USB interface (e.g., throughput and data rates are unaffected by the circuit 100). However, USB communication is interrupted while a fault condition exists.

Figure 2:
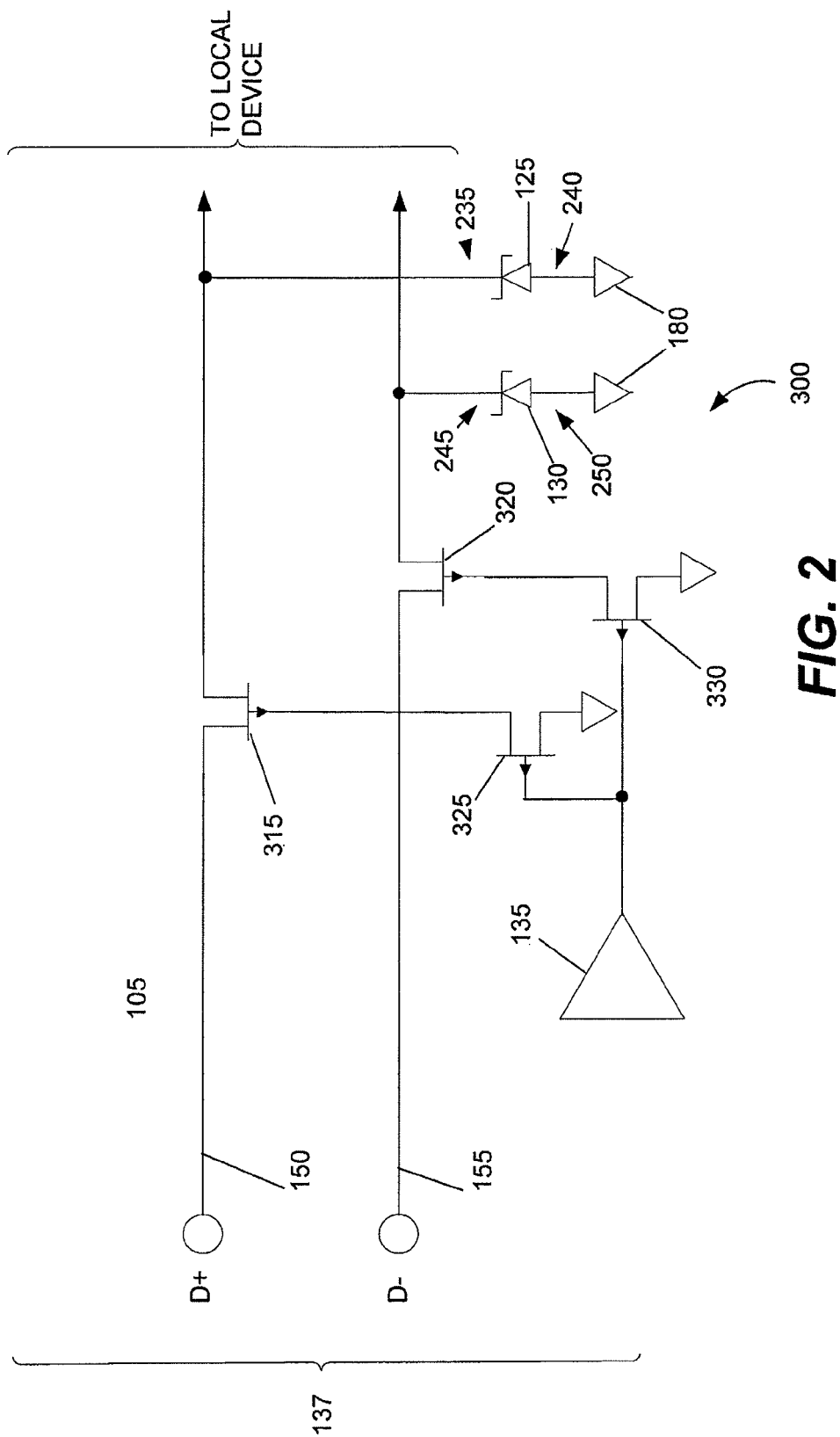
FIG. 2 is a schematic diagram of an embodiment of a circuit for isolating data lines of a USB interface.

FIG. 2 is a schematic diagram of an embodiment of a circuit 300 for isolating the data lines of a USB interface. The circuit 300 is part of a larger circuit (similar to circuit 100 of FIG. 1).

The circuit 300 includes a first opto coupled switch 315 (e.g., an opto coupled field effect transistor), a second opto coupled switch 320, a first drive switch 325, a second drive switch 330, a first electrostatic discharge (ESD) protection diode 125 (e.g., a zener diode), a second ESD diode 130, and a windowing comparator 135.

The circuit 300 is connected to a standard USB cable 137. The USB cable 137 includes a D+ line 150 (a first data connection) and a D− line 155 (a second data connection) as is known in the industry. The lines are intended to couple a local device to a USB cable via a USB connector and ultimately to a remote device. The circuit 300 can be incorporated into a USB connector or can be part of the local device.

The first switch opto coupled 315 has a first node 400 coupled to the D+ line 150, a second node 405 coupled to a D+ line of the circuit that is interfacing with the USB, and an input 410 driven by the first drive switch 320. The first drive switch 320 is driven by an output 215 of the comparator 135. The second opto coupled switch 320 has a first node 420 coupled to the D− line 155, a second node 425 coupled to a D− line of the circuit that is interfacing with the USB, and an input 430 driven by the second drive switch 325. The second drive switch 325 is also driven by the output 215 of the comparator 135.

The circuit 300 operates similar to the circuit 100 described above. However, the first and second opto coupled switches 320 and 325 provide a greater level of isolation than the switches of circuit 100 when a fault occurs.

Figure 3:
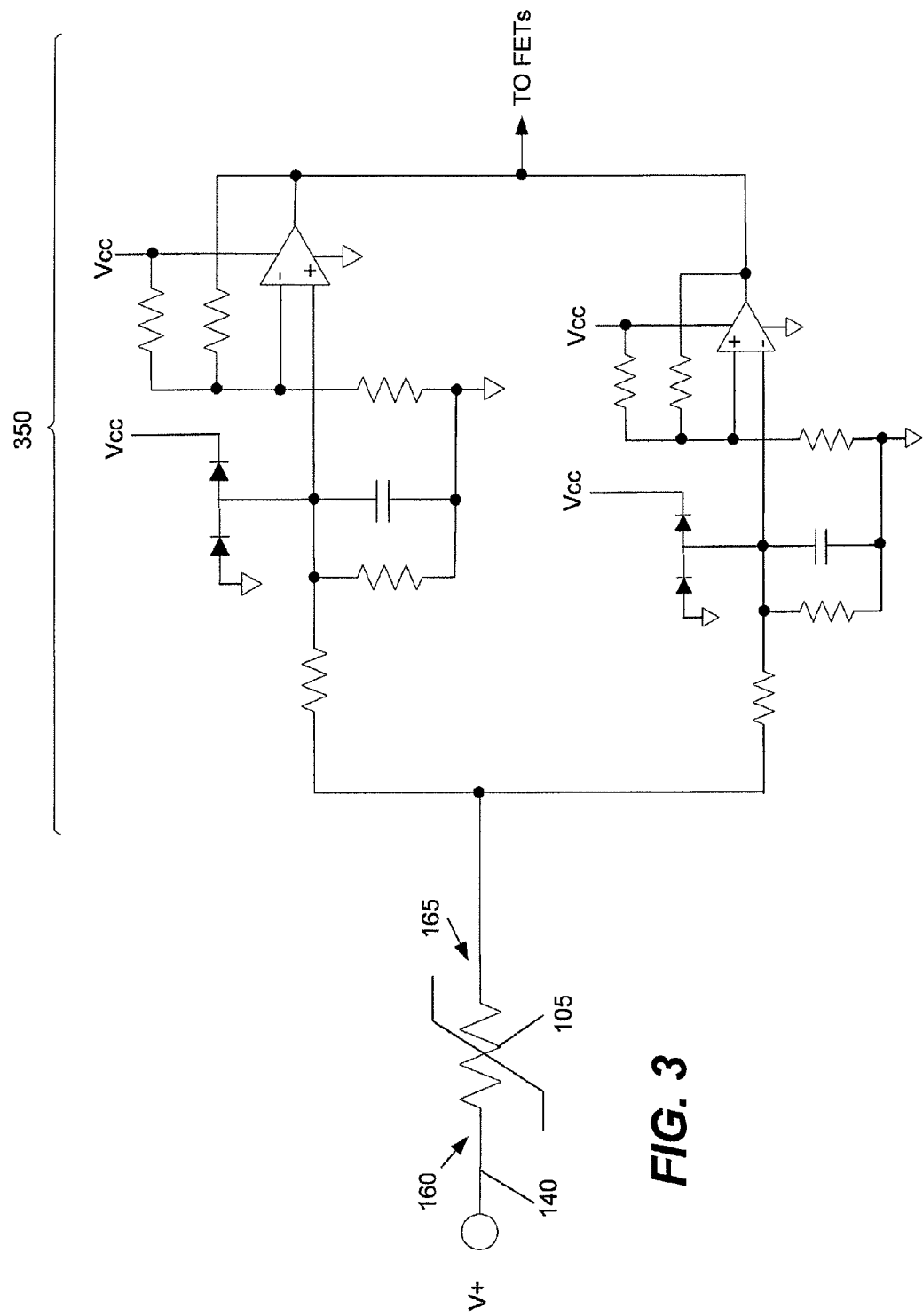
FIG. 3 is a schematic diagram of an embodiment of a windowing comparator.

FIG. 3 is a schematic of an alternative embodiment of a windowing comparator 350 for driving the switch circuits of circuits 100 and 300. In the embodiment shown, the windowing comparator 350 is driven by the V+ line 140 of the USB through the first resettable device 105. The windowing comparator 350 drives the switches whenever a fault condition occurs resulting in a large positive or negative voltage being present.

In another embodiment the invention provides protection for the V+ line by introducing another switching element in place of the first resettable device. This method provides higher voltage protection than is available with only a resettable device In another embodiment the invention uses the voltage differential between the local ground and the V+ signal from the USB interface as one the inputs to the windowing comparator with a reference voltage derived from a local power supply as the other input. This embodiment requiring only a positive power supply on the windowing comparator.

Various features and advantages of the invention are set forth in the following claims.

What is claimed is:

1. A universal serial bus (USB) protection circuit, the circuit comprising:
    a V+ line configured to be connected to a V+ connection of a USB cable;
    a ground line configured to be connected to a ground connection of the USB cable;
    a D+ line configured to be connected to a D+ connection of the USB cable;
    a D− line configured to be connected to a D− connection of the USB cable;
    a first resettable device coupled to the V+ line and linking the V+ line to a V+ of a local device;
    a second resettable device coupled to the ground line and linking the ground line to a common node of the local device;
    a windowing comparator having a negative input coupled to the common node and a positive input coupled to the ground line;
    a first switch coupled between the D+ line and a D+ of the local device, the first switch driven by an output of the comparator; and
    a second switch coupled between the D− line and a D− of the local device, the second switch driven by the output of the comparator.

2. The circuit of claim 1, further comprising a first electrostatic discharge protection diode coupled between the D+ of the local device and the common node, and a second electrostatic discharge protection diode coupled between the D− of the local device and the common node.

3. The circuit of claim 1, wherein a ground fault causes a resistance of the second resettable device to increase causing the output of the windowing comparator to drive the first and second switch to an open state.

4. The circuit of claim 3, wherein the resistance of the second resettable device returns to near zero ohms when the ground fault is removed.

5. The circuit of claim 1, wherein a fault causes a resistance of the first resettable device to increase.

6. The circuit of claim 5, wherein the resistance of the first resettable device returns to near zero ohms when the fault is removed.

7. The circuit of claim 1, wherein the throughput and data rates of the USB communication are not impacted by the first and second resettable devices and the first and second switches when no fault is present.

8. A method of protecting a local device coupled to a universal serial bus cable, the method comprising:
increasing a resistance of a resettable device when a ground fault occurs to uncouple a common node of the local device from a ground line;
detecting a voltage differential between the common node and the ground line;
opening a first switch uncoupling a first data line from the local device; and
opening a second switch uncoupling a second data line from the local device.

9. The method of claim 8, further comprising decreasing the resistance of the resettable device when the ground fault is removed, coupling the common node of the local device to the ground line; detecting the lack of the voltage differential between the common node and the ground line; closing the first switch coupling the first data line to the local device; and closing the second switch coupling the second data line to the local device.

10. A universal serial bus (USB) protection circuit, the circuit comprising:
a V+ line configured to be connected to a V+ connection of a USB cable;
a ground line configured to be connected to a ground connection of the USB cable;
a D+ line configured to be connected to a D+ connection of the USB cable;
a D− line configured to be connected to a D− connection of the USB cable;
a first resettable device coupled to the V+ line and linking the V+ line to a V+ of a local device;
a second resettable device coupled to the ground line and linking the ground line to a common node of the local device;
a windowing comparator coupled to the first resettable device;
a first switch coupled between the D+ line and a D+ of the local device, the first switch driven by an output of the comparator; and
a second switch coupled between the D− line and a D− of the local device, the second switch driven by the output of the comparator.

11. The circuit of claim 10, further comprising a first electrostatic discharge protection diode coupled between the D+ of the local device and the common node, and a second electrostatic discharge protection diode coupled between the D− of the local device and the common node.

12. The circuit of claim 10, wherein a ground fault causes a resistance of the second resettable device to increase causing the output of the windowing comparator to drive the first and second switch to an open state.

13. The circuit of claim 12, wherein the resistance of the second resettable device returns to near zero ohms when the ground fault is removed.

14. The circuit of claim 10, wherein a fault causes a resistance of the first resettable device to increase.

15. The circuit of claim 14, wherein the resistance of the first resettable device returns to near zero ohms when the fault is removed.

16. The circuit of claim 10, wherein the throughput and data rates of the USB communication are not impacted by the first and second resettable devices and the first and second switches when no fault is present.

17. The circuit of claim 10, wherein the first and second switches are opto coupled FETs.

* * * * *